(12) United States Patent
Ito et al.

(10) Patent No.: US 7,495,241 B2
(45) Date of Patent: Feb. 24, 2009

(54) ION BEAM IRRADIATION APPARATUS AND INSULATING SPACER FOR THE SAME

(75) Inventors: Katsumi Ito, Tokyo (JP); Kazuya Maekawa, Tokyo (JP); Etsuo Takeuchi, Tokyo (JP); Nobuo Yajima, Tokyo (JP); Junichi Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 363 days.

(21) Appl. No.: 11/048,802

(22) Filed: Feb. 3, 2005

(65) Prior Publication Data

US 2005/0211926 A1 Sep. 29, 2005

(30) Foreign Application Priority Data

Feb. 26, 2004  (JP) .............................. 2004-051457
Feb. 26, 2004  (JP) .............................. 2004-051459
Feb. 26, 2004  (JP) .............................. 2004-051462
Mar. 29, 2004  (JP) .............................. 2004-094332

(51) Int. Cl.
 *H01J 27/02* (2006.01)
(52) U.S. Cl. .............................. 250/492.21; 250/492.1; 250/492.3; 250/423 R; 315/111.21; 315/111.81
(58) Field of Classification Search ............ 250/492.21, 250/492.3, 396 R, 423 R, 492.1; 204/298.11, 204/192.34, 298.36, 192.11, 492.21; 216/60; 156/626; 118/50.1; 315/111.81, 111.21
See application file for complete search history.

(56) References Cited

U.S. PATENT DOCUMENTS 4,450,031 A * 5/1984 Ono et al. .............. 156/345.39
4,758,304 A * 7/1988 McNeil et al. ................ 216/60
5,036,252 A * 7/1991 Lob ....................... 315/111.31
5,177,398 A * 1/1993 Engemann ............... 313/360.1
5,811,820 A * 9/1998 Kirchner et al. ......... 250/432 R
5,985,102 A * 11/1999 Leiphart ................. 204/192.12
6,246,162 B1 * 6/2001 Kahn et al. .............. 313/360.1
2005/0098742 A1 * 5/2005 Kellerman et al. ..... 250/492.21
2006/0192132 A1 * 8/2006 Kanarov et al. ......... 250/396 R

FOREIGN PATENT DOCUMENTS

JP       59-63729        4/1984
JP       61-34832        2/1986

(Continued)

OTHER PUBLICATIONS

IBM Corporation, Integral Insulated Support Structures for Ion Optics, Aug. 1982, IBM Technical Disclosure Bulletin, vol. 25, Issue No. 3B, p. No. 1673-1676.*

*Primary Examiner*—Jack I Berman
*Assistant Examiner*—Michael J Logie
(74) *Attorney, Agent, or Firm*—Oblon, Spivak, McClelland, Maier & Neustadt, P.C.

(57) ABSTRACT

The frequency of replacement of an insulating spacer disposed between grids of an ion beam irradiation apparatus is to be reduced. In addition, the intervals of the multiple grids in the ion beam irradiation apparatus are to be kept constant. To achieve these objects, in a so-called insulating spacer provided for maintaining insulation between the grids, a groove portion having a bottom onto which sputtered materials are hard to adhere is provided on the central portion of the side surface of the insulating spacer all along its circumference.

11 Claims, 6 Drawing Sheets

FOREIGN PATENT DOCUMENTS

| | | |
|---|---|---|
| JP | 63 171954 | 11/1988 |
| JP | 2 65033 | 3/1990 |
| JP | 4-94036 | 3/1992 |
| JP | 6-231712 | 8/1994 |
| JP | 7-41957 | 7/1995 |
| JP | 8-129982 | 5/1996 |
| JP | 8-167397 | 6/1996 |
| JP | 2000-113849 | 4/2000 |
| JP | 2000-301353 | 10/2000 |
| JP | 2002-216653 | 8/2002 |

* cited by examiner

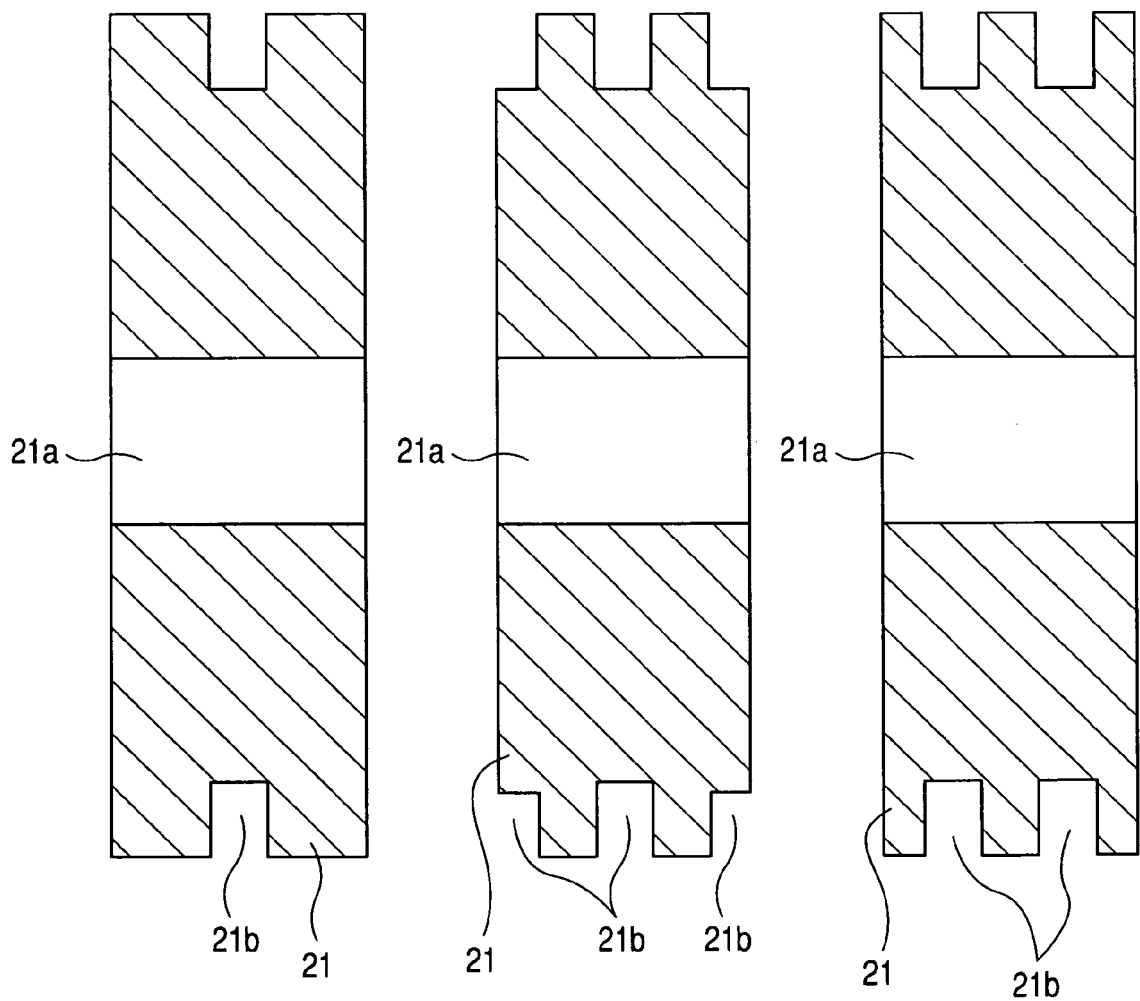

ION BEAM IRRADIATION APPARATUS AND INSULATING SPACER FOR THE SAME

BACKGROUND OF THE INVENTION

1. Field of the Invention

The present invention relates to an ion beam irradiation apparatus for extracting an ion beam from a plasma generated in a chamber through a grid to which a predetermined voltage is applied to emit an ion beam to a predetermined direction. More particularly, the present invention relates, for example, to an ion milling apparatus for processing a surface of an article to be processed using the extracted ion beam, an ion implantation apparatus for implanting ions into a film using the extracted ion beam, an ion beam deposition apparatus for forming a film, and an insulating member used in these apparatuses as a spacer in fixing a grid.

2. Related Background Art

For example, the milling apparatus utilizing an ion beam uses a plasma generated in a chamber as an ion source. The apparatus extracts ions from the ion source using a plurality of grids to which a DC voltage is applied to accelerate the ions in a predetermined direction, and performs milling using the accelerated ions. Generally, each of the grids has a hole portion or a number of hole portions (small holes), and different DC voltages are applied to them in order to optimize the energy of the extracted ions or to optimize the distribution of the ions. Here, the term "milling" refers to a process in which accelerated ions are made to strike a surface of an article to be processed to cause sputtering, thereby achieving a fine processing on the surface (see for example Japanese Patent Application Laid-Open No. 2000-113849).

Between the grids, there is provided insulating spacers, which are generally made of an insulating material, in order to prevent mutual contact of the grids and to keep their intervals constant. When, for example, the milling is carried out using a extracted ion beam, the surface of the article to be processed is sputtered by the ion beam. When the ions are extracted from the chamber through the grids, all of the ions accelerated by the grids do not reach the exterior of the chamber, but a part of the ions impinge on the grids or other parts to cause sputtering. The materials thus sputtered from the surface of the article to be processed or the grids etc. will adhere in some portion in the interior of the apparatus.

If the adhering material is electrically conductive, for example, the insulation performance of the insulating spacers is deteriorated with an increase in the adhering material, which can eventually lead to short-circuit of the grids. In order to avoid such a situation from occurring, it is necessary to perform an operation for removing the adhering film when the material adhering on the insulating spacers develops to some extent or to replace the insulating spacers with new ones. Accordingly, for example in the case that a metal film is to be processed by a milling operation, the insulating performance is fast deteriorated by adhesion of the metal, and therefore it is necessary to perform the operations for preventing short-circuit at a significantly short cycle. As a solution for prolonging the cycle of such operations, Japanese Patent Application Laid-Open No. 2000-301353 discloses an insulating spacer having an enlarged surface area realized by providing an annular projection with a tapered cross section.

The operation of removing the adhering film is generally performed by a blast process or a chemical processing such as acid cleaning. In these operations, when the adhering film is removed, the surface of the insulating spacer itself is subjected to the processing, and the surface will be broken or partly removed. Consequently, the outer shape of the insulating spacer will become small. Therefore, it is considered that the thickness of the insulating spacer will be decreased by the aforementioned processing and the space between the grids becomes small.

The insulating spacer disclosed in Japanese Patent Application Laid-Open No. 2000-301353 is effective in reducing the frequency of the replacement of the spacer. However, the provision of the annular projection results in an increase in the outer diameter of the spacer. Therefore, the size of the annular projection is limited to sizes that do cause interference with the hole portions in the grid. In the above document, the area in which the insulting spacer is used is an area that is spaced apart from the hole portions of the grid. In the ion beam irradiation apparatus, it is necessary to keep the intervals of the plurality of grids substantially constant. Accordingly, it is preferable, if possible, that insulating spacers inserted and fixed between the grids to keep their intervals can be disposed irrespective of whether the hole portions are present or absent.

In the ion beam irradiation apparatus, it is known that the beam irradiation condition changes with time while the apparatus is running. This is because the grid intervals change with time due to heat from the plasma or other factors and the energy of the extracted ions changes as the ion beam irradiation continues in accordance with the grid intervals. Typically, the aforementioned change returns to generally original state, but a small change that cannot be restored will accumulate with an increase in the number of times of running of the apparatus. Thus, the energy distribution of the ions in the ion beam changes with time. Consequently, there is a risk that operations such as milling cannot be performed appropriately unless the condition of the ion beam is minitored continuously to control the energy distribution by feedback.

Generally, ions extracted from a plasma inherits the ion distribution (or the ion density) in the plasma, and therefore the quantity of the extracted ions is not uniform depending on the extracted position. Therefore, when milling of an article to be processed is to be performed, it is required to make the energy or the quantity distribution of the extracted ions uniform. The parameters that can be easily changed in the apparatus include distance between the grids, the distance between the grids and the article to be processed and the diameter of the small holes formed on the grids. By adjusting these parameters, it is possible to make the distribution or the energy of the extracted ions uniform to some extent. In addition, it is considered that the distribution or the energy of the extracted ions can be made uniform by improving the condition of the plasma as the ion source.

However, alteration of the intervals of the grids or the distance between the grids and the article to be processed does not result in improvement in the basic distribution. In addition, the alteration of the plasma condition has not been positively tried so far since it is difficult to be monitored. Accordingly, in order to meet the aforementioned requirement, the method in which the density of small holes formed on the grids in order for ions to pass is varied in accordance with the ion density has been used in many cases, as disclosed for example in Japanese Patent Application Laid-Open NO. 8-129982. Specifically, the number of the small holes in the area of a grid that corresponds to the portion in the plasma in which the ion density is high is made small to reduce the quantity of the ions extracted from this area, and the number of the small holes in the area that corresponds to the portion in the plasma in which the ion density is low is made large so that the quantity of the ion passing through the grid will be made uniform.

To put it differently, in the above-described solution, the portion in the plasma in which the ion density is low is standardized, and in the portion in which the ion density is high, only a part of the ions are extracted so that the quantity of the extracted ion is made uniform. Consequently, there are a large amount of ions that are blocked by the grids and do not contribute to milling or other operations. Thus, an improvement in the operation efficiency of the apparatus is demanded. In addition, the ions blocked by the grids sputter the grid surface, which can be a cause of impurities contained in the ion beam.

In the above-described method, uniformization of the extracted ion quantity is attempted by extracting an appropriate quantity of ions in accordance with the position basically without any improvement in the ion density distribution in the plasma. Therefore, in the case that ion density distribution is extremely inhomogeneous due to some conditions such as the gas type or the discharge pressure, it is considered that there may occur such a situation that the uniformization per se is difficult to be achieved or that the extracted ion quantity of the portion standardized for the uniformization is too small to be practically used. Accordingly, there is the possibility that the extraction of the ion can be effected only in limited conditions, and versatility of the apparatus as such may be restricted.

SUMMARY OF THE INVENTION

The present invention has been made in view of the above-described and other requirements. An object of the present invention to provide an insulating spacer To achieve the above object, according to the present invention, there is provided an ion beam irradiation apparatus comprising, a plasma generation chamber in the interior of which a plasma is generated, a process chamber connected with the plasma generation chamber, a plurality of grids disposed between the plasma generation chamber and the process chamber to extract ions in the plasma from the plasma generation chamber to the process chamber, each of the grids having a number of small holes, and an insulating spacer disposed between the grids for preventing the grids from being in electrical contact with each other, wherein a groove portion that is represented in a cross section taken along an axial direction of the insulating spacer as a recess formed in a direction different from the direction in which the ion beam is extracted is formed on a surface of the insulating spacer that is different from the surfaces abutting the grids, all along the circumference of the insulating spacer.

In the above-described ion beam irradiation apparatus, it is preferable that the groove portion be represented in the cross section of the insulating spacer as a recess that is formed in a direction perpendicular to the direction in which the ion beam is extracted. In connection with this, it is more preferable that an edge portion of the groove portion that defines the opening of the recess is chamfered. Furthermore, it is preferable that the insulating spacer have a cylindrical shape, and the groove portion be formed on the side surface of the cylindrical shape. Still further, it is preferable that the ratio of the opening of the recess to the depth of the recess be equal to or larger than 1.

If for example an ion milling apparatus is to be constructed, it is preferable the above-described ion beam irradiation apparatus includes a process chamber into which ions extracted from the ion beam irradiation apparatus is to be introduced, and a holder disposed in the process chamber, for holding an article to be processed at a position at which it is irradiated with the extracted ions.

In order to achieve the aforementioned object, according to the present invention, there is provided an insulating spacer to be used in an ion beam irradiation apparatus including a plasma generation chamber in the interior of which a plasma is generated, a process chamber connected with the plasma generation chamber, and a plurality of grids disposed between the plasma generation chamber and the process chamber for extracting ions in the plasma, each of the grids having a number of small holes, the insulating spacer being disposed between the plurality of grids to prevent the grids from being in electrical contact with each other, wherein a groove portion represented in a cross section as a recess formed in a direction different from the direction in which the ion beam is extracted is formed on a surface of the insulating spacer that is different from the surfaces abutting the grids, all along the circumference of the insulating spacer.

In the above-described insulating spacer, it is preferable that the groove portion be represented in the cross section of the insulating spacer as a recess that is formed in a direction perpendicular to the direction in which the ion beam is extracted. In connection with this, it is more preferable that an edge portion of the groove portion that defines the opening of the recess is chamfered. Furthermore, it is preferable that the insulating spacer have a cylindrical shape, and the groove portion be formed on the side surface of the cylindrical shape. Still further, it is preferable that the ratio of the opening of the recess to the depth of the recess be equal to or larger than 1.

According to the present invention, a groove portion is provided on the side surface of the insulating spacer having a substantially cylindrical shape in such a way as to encircling around the side surface. It is known that in the film forming process in the vacuum such as sputtering, it is generally difficult to form a film in the interior of a groove portion. Particularly, in the process like milling, a surface of an article to be processed is sputtered for surface processing, and sputtered material will adhere on the insulating spacer significantly. By making the width of the aforementioned groove portion smaller than a certain width and making its depth larger than a certain depth, an area on the insulating spacer in which a film is hard to adhere can be formed. Even in the case that reduction of the width of the groove portion and the expansion of the depth of the groove portion are restricted for example in view of the strength of the insulating spacer, the frequency of replacement of the insulating spacer is greatly reduced as compared to conventional insulating spacers by virtue of the presence of the groove portion.

The present invention can be carried out only by forming a continuous groove portion on the side surface of an insulating spacer. Therefore, the area of the cross section perpendicular to the axis of the insulating spacer is substantially constant except for the grooved portion. Accordingly, in contrast to the insulating spacer disclosed in patent document 2, if it is possible to reduce the outer diameter of the portion having the constant cross section, it is thereby possible to decrease the possibility of affection of the insulating spacer on the ion beam. In addition, even in the area on the grid in which small holes are formed, if an area as large as the aforementioned cross sectional area is present between the small holes, it is possible to extract ions equivalently irrespective of whether the insulate space is set or not. Therefore, the insulating spacer of the present invention can be set on any portion of the grids to keep the intervals of the grids constant.

When there are members having different electric potentials in a vacuum, if the insulating performance of the surface of an insulating member present between them is deteriorated due to, for example, adhesion of a film, a phenomenon called surface discharge sometimes occurs, that is, discharge occurs in the surface of the insulating member to cause short-circuit of the members. With the provision of the aforementioned groove portion, it is possible to reduce the possibility of occurrence of the so-called surface discharge to prevent short-circuit due to the surface discharge.

In another aspect, the present invention has been made in view of the above-described and other requirements, and an object of the invention is to provide an insulating spacer that can keep a grid interval constant even when an operation such as removal of the adhering film is performed. In addition, another object of the present invention is to provide an ion beam irradiation apparatus in which changes in the operating condition of the apparatus caused by replacement of the insulating spacer or other reasons is reduced with the use of the above-mentioned insulating spacer.

To achieve the above object, according to the present invention, there is provided An ion beam irradiation apparatus comprising a plasma generation chamber in the interior of which a plasma is generated, a process chamber connected with the plasma generation chamber, a plurality of grids disposed between the plasma generation chamber and the process chamber to extract ions in the plasma from the plasma generation chamber to the process chamber, each of the grids having a number of small holes, and an insulating spacer disposed between the grids for preventing the grids from being in electrical contact with each other, wherein the insulating spacer has a disk-like shape having top and bottom surfaces and a through hole passing through the top and bottom surfaces, the through hole has an inner diameter equal to or slightly larger than the small hole of the grids, and the outer diameter of the disk-like shape is of such a size that the insulating spacer does not affect the ions that pass through the small holes adjacent to the small hole on which the insulating spacer is fixed.

In the above-described insulating spacer, it is preferable that a groove portion that is represented in a cross section taken along an axial direction of the insulating spacer as a recess formed in a direction perpendicular to the direction in which the ion beam is extracted be formed all along the side surface of the insulating spacer.

If for example an ion milling apparatus is to be constructed, it is preferable that above-described ion beam irradiation apparatus includes a process chamber into which ions extracted from the ion beam irradiation apparatus is to be introduced, and a holder disposed in the process chamber, for holding an article to be processed at a position at which it is irradiated with the extracted ions.

In order to achieve the aforementioned object, according to the present invention, there is provided an insulating spacer to be used in an ion beam irradiation apparatus including a plasma generation chamber in the interior of which a plasma is generated, a process chamber connected with the plasma generation chamber, and a plurality of grids disposed between the plasma generation chamber and the process chamber for extracting ions in the plasma, each of the grids having a number of small holes, the insulating spacer being disposed between the plurality of grids to prevent the grids from being in electrical contact with each other, wherein the insulating spacer has a disk-like shape having top and bottom surfaces and a through hole passing through the top and bottom surfaces, the through hole has an inner diameter equal to or slightly larger than the small hole of the grids, and the outer diameter of the disk-like shape is of such a size that the insulating spacer does not affect the ions that pass through the small holes adjacent to the small hole on which the insulating spacer is fixed.

In this insulating spacer, it is preferable that a groove portion that is represented in a cross section taken along an axial direction of the insulating spacer as a recess formed in a direction perpendicular to the direction in which the ion beam is extracted be formed all along the side surface of the insulating spacer.

According to the present invention, the insulating spacer has a disk-like shape that is in contact with grids at its both end surfaces, and a film will adhere on its side surface. By making the end surfaces flat and parallel to each other, it is possible to keep the interval of the grids constant. In addition, the ratio of the side surface to the end surface of the insulating spacer is made large. When an adhering film is to be removed by, for example, a blast process, the area on the end face that is required to be subjected to the blast process is the outer peripheral region in which a film adheres, and it is not necessary to perform the blast process on the central region. Therefore, in the insulating spacer according to the present invention, it is not necessary to effect the blast processing on the most part of the end surfaces, and even if a adhering film on the side surface is removed, the end surfaces are not affected by the removal operation.

The insulating spacer according to the present invention can be fixed between the grids utilizing one of the small holes formed on the grids by mean of a fixing apparatus, without affecting the small holes around it. Therefore, it can be fixed on any portion of the grids. In other words, it is possible to dispose the insulating spacer at any desired position in the area on the grids through which ions are extracted to keep the intervals of the grids constant. Furthermore, when milling is carried out using the ion beam, the insulating spacer can be disposed at an appropriate position on the grid in accordance with the distribution of the milling rate to easily make the milling rate or the acceleration of the extracted ion beam constant.

In a different aspect, the present invention has been made in view of the circumstances described before, and an object of the invention is to provide an ion beam irradiation apparatus in which the area over which the ion quantity is uniform is enlarged and the ions in the plasma can be always used efficiently.

According to the present invention, there is provided an ion beam irradiation apparatus adapted to extract ions in a plasma generated in a plasma generation chamber through small holes formed on a plurality of grids to generate an ion beam, comprising an insulating member disposed between the plurality of grids or the plasma generation chamber side surface of the grid that is adjacent to the plasma generation chamber and on a portion of the grids that corresponds to the area over which the irradiation ion beam is extracted, wherein the small holes are arranged on the plurality of grids in such a way as to be aligned in a predetermined direction, and the insulating member has a shape that does not interfere with the alignment of the small holes when the insulating member is set.

In the above-described ion beam irradiation apparatus, it is preferable that the insulating member disposed between the grids be a sheet-like member having small holes aligned with the small holes of the grids, and the electric capacitance between the plurality of grids to a predetermined value be adjusted by the insulating member. Alternatively, in the above-described ion beam irradiation apparatus, it is preferable that the insulating member disposed on the plasma generation chamber side surface of the grid adjacent to the plasma generation chamber be a sheet-like member having small holes aligned with the small holes on the grid, and the insulating member form a flat ion sheath by self-bias. In these arrangements, it is preferable that the insulating member have a substantially disk-like shape corresponding to the grids, wherein the insulating member has a substantially disk-like shape corresponding to the grid. In the above-described ion beam irradiation apparatus, it is preferable that the insulating member disposed on the plasma generation chamber side surface of the grid adjacent to the plasma generation chamber be disposed at a position corresponding to the area in which the quantity of ions in the extracted ion beam in the state in which the insulating member is not set is small.

If for example an ion milling apparatus is to be constructed, it is preferable that the apparatus include the above-described ion beam irradiation apparatus, a process chamber into which ions extracted from the ion beam irradiation apparatus is to be introduced, and a holder disposed in the process chamber, for holding an article to be processed at a position at which it is irradiated with the extracted ions.

According to the present invention, the insulating member is disposed on the surface of the grid adjacent to the plasma to generate a self-bias effect, thereby forming an ion sheath positively to control the plasma generation condition so that the ion density in the discharge space can be made uniform. Therefore, even if ions are extracted from all over the generated plasma evenly, the obtained ion quantity is substantially uniform throughout the ion extraction area. In other words, as compared to the prior art described before, the amount of the ions blocked by the grids is greatly reduced, and the utilization efficiency of ions can be enhanced. In addition, the amount of the ions blocked by the grids, or the ions that sputters the grids is reduced, so that inclusion of impurity elements into the ion beam from the grids can also be greatly reduced.

According to the present invention, a member made of an insulating material is locally inserted between grids to differentiate the electric capacitance between the grids locally. By selecting the insulating material appropriately or changing the thickness of this member to control the distance between the grids more finely, it is possible to partially change the energy (or the speed) of the ions. By virtue of this effect, it is possible to further correct, for example, the milling rate, which depends on the quantity of the extracted ions, to obtain a more uniform milling rate.

It is known that generally in the ion beam extraction apparatus of the above-described type, the grid intervals etc. change with an increase in the interior temperature of the apparatus or other conditions under operation, and therefore the quantity of the extracted ions, its distribution or other factors does not become stable until a significant time has elapsed. By inserting a member made of an insulating material between grids as taught by the present invention, the grid interval can be always kept constant, and it is possible to eliminate an preparatory operation for stabilizing the apparatus, which is required in conventional apparatuses.

BRIEF DESCRIPTION OF THE DRAWINGS

FIG. 4A shows a modification of the insulating member according to the first embodiment.

FIG. 4B shows a modification of the insulating member according to the first embodiment.

FIG. 4C shows a modification of the insulating member according to the first embodiment.

DESCRIPTION OF THE PREFERRED EMBODIMENTS

Figure 1:
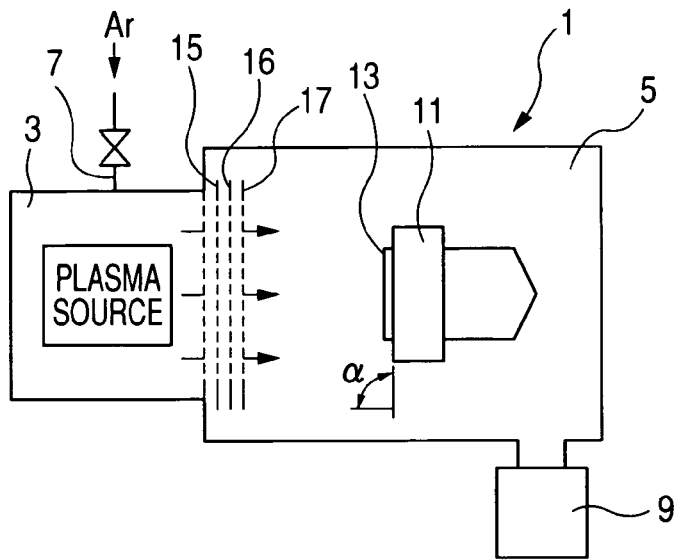
FIG. 1 schematically shows the structure of an ion beam irradiation apparatus in which insulating members according to a first embodiment of the present invention are used.

In the following, embodiments of the present invention will be described with reference to the drawings. FIG. 1 schematically shows the outline of an ion milling apparatus 1 equipped with, as an ion source, an ion beam irradiation apparatus having insulating spacers according the first embodiment of the present invention. The apparatus 1 is composed of two chambers, that is, a plasma generation chamber 3 and a process chamber 5. In the plasma generation chamber 3 in this embodiment, for example argon gas is supplied to the plasma generation chamber through a gas supply system 7 as the gas to be subjected to plasma generation. There are various methods of generating a plasma such as the Kaufmann type, the bucket type, the ICP type and the ECR type, and any of these method may be employed. In this embodiment, the plasma is generated by an IPC type system in which the possibility of inclusion of impurity elements in the ion beam is relatively low and the structure of the apparatus is simple. The process chamber 5 is connected with an exhaust system 9, which exhausts the gases etc. contained in the interior thereof to keep interior space of the plasma generation chamber 3 and the process chamber 5 at a predetermined operation pressure.

Figure 2:
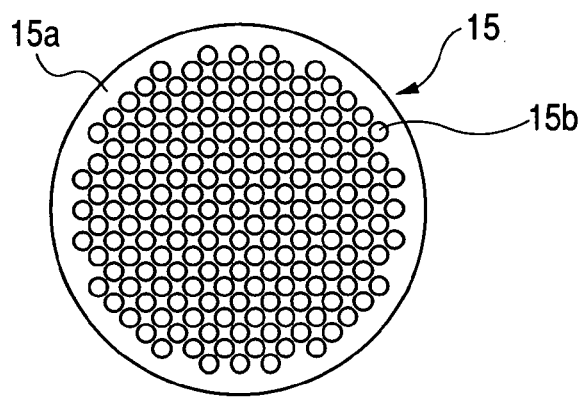
FIG. 2 is a front view showing a grid used in the ion beam irradiation apparatus shown in FIG. 1.

In the interior of the process chamber 5, there is provided a holder 11 for supporting an article to be processed 13. In this drawing, the article to be processed 13 is held in such a way as to be opposed to the plasma generation chamber, but the orientation of the holder 11 relative to the plasma generation chamber 3 can be changed. Between the plasma generation chamber 3 and the process chamber 5, there is provided a first, second and third grids 25, 26 and 17 in the mentioned order from the plasma generation chamber 3 side. The first grid 15 as seen from its front side is shown in FIG. 2. The grid 15 is produced by forming a plurality of small holes 15b on a disk like member 15a. The second and the third grids have the same structure. These grids are disposed in such a way that the small holes on the grids are aligned along the direction from the plasma generation chamber 3 toward the process chamber 5.

To the first and the third grids 15 and 17, positive voltages, which function as acceleration voltages, are applied. To the second grid 16, a negative voltage, which function as a deceleration voltage, is applied. Argon ions included in the plasma generated in the plasma generation chamber 3 pass through the small holes formed in the grids and directed as an ion beam onto the surface of the article to be processed 13. In addition, in the downstream (with respect to the direction of the ion beam) of the third grid 17, a neutralizer (not shown) is provided to neutralize the ion beam.

Figure 3:
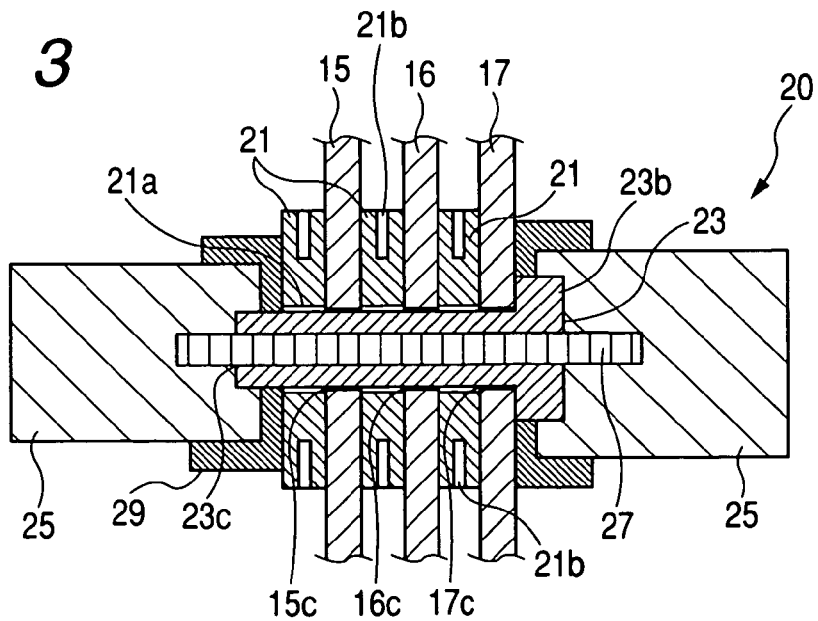
FIG. 3 is a cross sectional view showing the structure of a fixing apparatus using the insulating members (spacers) according to the first embodiment of the present invention are used.

FIG. 3 shows a fixing apparatus for fixing the first to third grids 15, 16, 17 at predetermined intervals and fixing insulating spacers between the grids. The fixing apparatus 20 is composed of insulating spacers 21, an insulating member 23, insulating caps 25, a screw rod 27 and grooved washers 29. The insulating spacer 21 is a disk like member made of an insulating material such as alumina. The insulating spacer 21 has a through hole 21*a* with a predetermined diameter that passes through from its top to bottom surfaces and a groove portion 21*b* formed all along the circumference of its side surface. The thickness of the disk corresponds to the distance between the grids. The insulating member 23 is a substantially cylindrical member including a shaft portion 23*a* with an outer diameter that can pass through the through hole 21*a* of the insulating spacer 21 and an enlarged diameter portion 23*b* having an enlarged diameter formed at one end thereof. The insulating member 23 has a through bore 23*c* that passes through it along the axial direction. In this embodiment, an insulating spacer 21 is also provided on the plasma generation chamber side of the grid 15 (namely, on the surface of the grid 15 that is different from its surface facing the grid 16). However, this spacer 21 may be eliminated if downsizing of the fixing apparatus is desired.

On the first to third grids 15, 16 and 17, holes 15*c*, 16*c* and 17*c* having a diameter substantially equal to that of the through hole 21*a* in the insulating spacer are respectively formed. When the grids are fixed, the grids and the plurality of spacers are alternately arranged, and the insulating member 23 is inserted through the through holes 21*a* and the holes 15*c*, 16*c* and 17*c*, so that positioning of these parts are achieved. In addition, an insulating spacer 21 is also disposed on the plasma generation chamber side surface of the first grid 15 adjacent to the plasma generation chamber 15. The screw rod 27 is inserted through the through bore 23*c* of the insulating member 23 in this state, and the insulating caps 25 are secured to both end portions of the screw rod 27 with the grooved washers 29 between. Thus, the grids and the plurality of insulating spacers are held and fixed. In connection with this, although the surface of the insulating caps 25 is exposed to a decompressed space in this embodiment, a metal cap may be additionally set on the surface thereof to protect the insulating caps and other members against adhesion of an electrically conductive film by sputtering to further prevent insulation failure from occurring. By using the above-described fixing apparatus, the insulating members can be sandwiched between the grids. In addition, the intervals of the grids can be varied by changing the thickness of the insulating spacers as needed. Furthermore, the electric capacitance between the grids can also be adjusted as desired by selecting the material of the insulating spacers 21 from materials with different dielectric constants such as quartz, machinable ceramics, fluorocarbon resins, and polyimide resins in addition to controlling the intervals of the grids.

In this embodiment, the insulating spacer 21 is a cylindrical member having a single groove portion 21*b*. The groove portion 21*b* has a width approximately one third of the thickness of the insulating spacer 21 and a depth of approximately half the radial thickness of the spacer wall. However, the shape of the insulating member 21 is not limited to this. For example, as shown in the cross sectional view in FIG. 4A, the width and the depth of the groove portion may be reduced. Even if the depth of the groove portion 21*b* is reduced, the rate of formation of the adhering film on its bottom will be reduced by a decrease in the width of the groove portion.

Specifically, it is considered that by making the ratio of the width to the depth of the groove portion equal to or more than 1, it is possible to facilitate reduction of the formation speed of the adhering film. In other words, the insulating spacer as a whole is prevented from becoming an electric conductor by forming a groove portion having such a bottom on which the material that may possibly adhere to the insulating spacer is hard to adhere on the insulating spacer with its starting point and ending point coinciding with each other. Thus, the frequency of replacement of the insulating spacers for avoiding short-circuit of the grids caused by adhering film on the surface of the insulating spacer 21 can be greatly reduced.

Here, why it is required to make the ratio of the width to depth of the aforementioned groove portion equal to or more than 1 will be described. For example in the case of an ion milling apparatus, if it is assumed that the supporting angle $\alpha$ is 0° (the incidence angle of the ion beam=90°), the ion beam is incident on the sputtered material from the perpendicular direction. If it is assumed that the sputtered material is obtained by total reflection of the ion beam, the sputtered material is incident on the electrode perpendicularly and incident on the bottom of the groove portion of the insulating spacer at the same angle (incidence angle $\theta$=90°). In this case, the aforementioned opening ratio may be less than 0.5.

For the support angle a of the holder in the range of $0°<\alpha\leq20°$ (in absolute value), the incidence angle $\theta$ is in the range of $50°\leq\alpha<90°$, and the fall of the etched material onto the bottom of the insulating spacer will not occur if the opening ratio is equal to or more than 0.85. For the support angle $\alpha$ of the holder in the range of $20°<\alpha\leq50°$ (in absolute value), the incidence angle $\theta$ is in the range of $0°\leq\alpha<50°$, and the ion beam totally reflected by the holder is not incident on the electrode directly, but it will frequently impinge on the inner wall of the process chamber or other portions. Although the ion beam impinging on the inner wall of the process room or other portions is further reflected and incident on the electrode, the fall amount of the sputtered material is small, since the energy of the ion beam has been greatly reduced. The incidence angle becomes minimum at the stage or supporting angle of 45°. In this case, the totally reflected ion beam is hardly reflected to the electrode since it impinges on the inner wall of the process chamber or other portions from the perpendicular direction, and the fall amount onto the insulating spacer is little. Therefore, it is considered that the opening ratio as small as 1 is acceptable.

For the support angle a of the holder in the range of $45°<\alpha<90°$ (in absolute value), the incidence angle $\theta$ is in the range of $0°<\alpha<90°$, and since the distance between the position on the inner wall of the process chamber or other portions at which the ion beam impinges and the electrode becomes large, the actual fall amount on the insulating spacer is estimated to be smaller than in the case that the support angle $\alpha$ of the holder is in the range of $0°<\alpha\leq45°$ (in absolute value). Therefore in the holder support angle $\alpha$ range of $0°<\alpha<90°$ (in absolute value), the amount of the sputtered material getting into the bottom of the groove portion of the insulating spacer can be reduced, and the discharge maintenance interval can be prolonged by changing the opening ratio in accordance with the support angle of the holder used.

Figure 6:
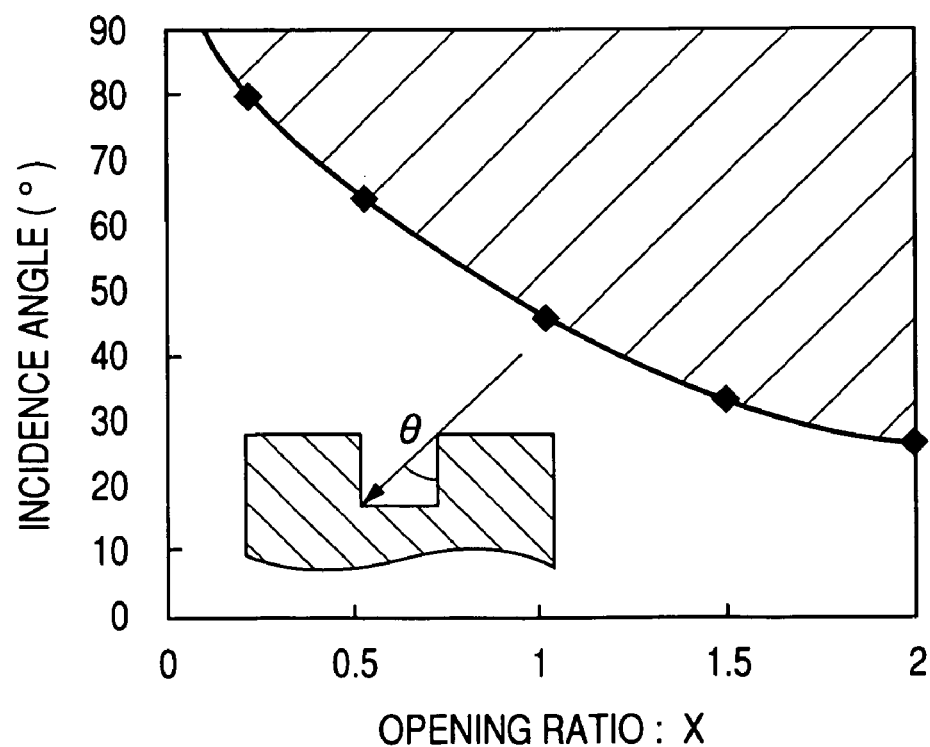
FIG. 6 shows a relationship between the incident angle θ in connection with adhesion of etched material onto the bottom of a groove portion and the opening ratio of the groove portion.

In FIG. 6, a relationship between the absolute value of the incidence angle (see angle $\theta$ in FIG. 6) and the opening ratio (namely, the ratio of the width to the depth of the groove portion). The inventor of the present patent application discovered that adhesion of the sputtered or etched material onto the bottom of the groove portion can be prevented if the condition represented by the hatched area in FIG. 6 is met.

Figure 5A:
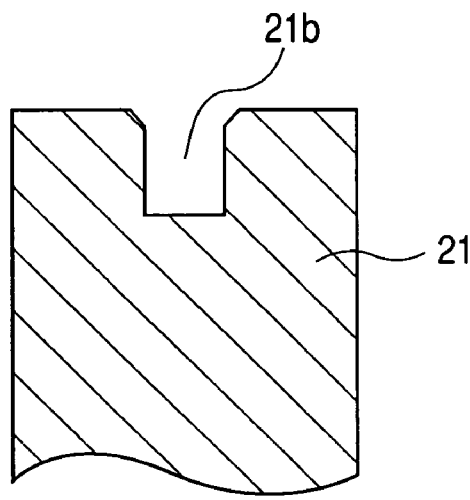
FIG. 5A is a cross sectional view showing the shape of a groove portion in a modification of the insulating member according to the first embodiment.
Figure 5B:
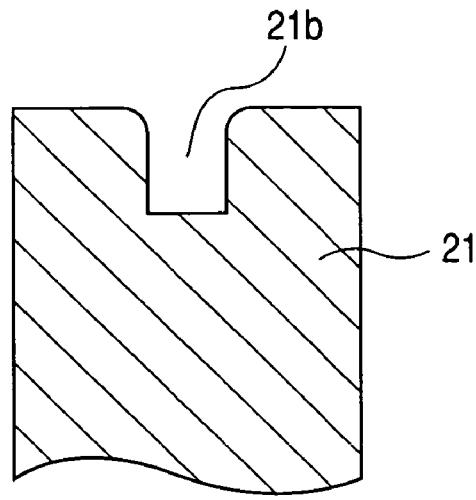
FIG. 5B is a cross sectional view showing the shape of a groove portion in a modification of the insulating member according to the first embodiment.

Although in this embodiment the arrangement in which only one groove portion 21b is formed has been described by way of example, the number of the groove portion(s) and the position at which the groove portion is formed are not limited to those of the illustrated mode. For example, the groove portion may have a shape like those shown in FIG. 4B or FIG. 4C. FIG. 4B shows the case in which groove portions 21b are formed on both the end portions. In the state that the insulating spacer 21 is sandwiched between grids, these groove portions on both the end portions practically serve as grooves defined between the grid surface and the non-grooved portion of the insulating spacer 21. FIG. 4C shows the case in which multiple groove portions are formed on the side surface of the insulating spacer 21. With the presence of the multiple groove portions on the insulating spacer, adhesion of a film on the groove portions can be avoided even if a adhesion film is formed on the surface of the insulating spacer, and short-circuit through the insulating spacer can be prevented. In addition, as shown in a cross sectional view presented as FIG. 5A or FIG. 5B, a planar or curved chamfer may be formed at the edge of the opening portion of the groove portion. By forming such a chamfer, break of the insulating spacer may be avoided.

Although the insulating spacer in this embodiment has a substantially cylindrical outer appearance, the shape of the insulating spacer according to the present invention is not limited to a cylindrical shape. The insulating spacer may have various shapes such a square shape or a shape with an enlarged diameter portion. Although in this embodiment the groove portion has a square shape in the axial cross section of the insulating spacer, this is not essential. Other types of groove portions that are formed all along the circumference of the insulating spacer on its surface different from the surfaces facing the grids and having in a cross sectional a groove formed along the direction different from the ion beam extracting direction may also be employed. By forming the groove portion all along the circumference of the insulating spacer with its start point coinciding with the end point, it is possible to reliably prevent contact of the surface adhering film between the upper and lower side of the groove portion facing to each other.

Next, an insulating spacer according to the second embodiment of the present invention will be described. The structure of the ion beam apparatus using the insulating spacer according to this embodiment is the same as that described in connection with the first embodiment, and the description thereof will be omitted. In the following description, the portions same as those described in connection with the first embodiment will be referred to using the same reference characters.

Figure 7:
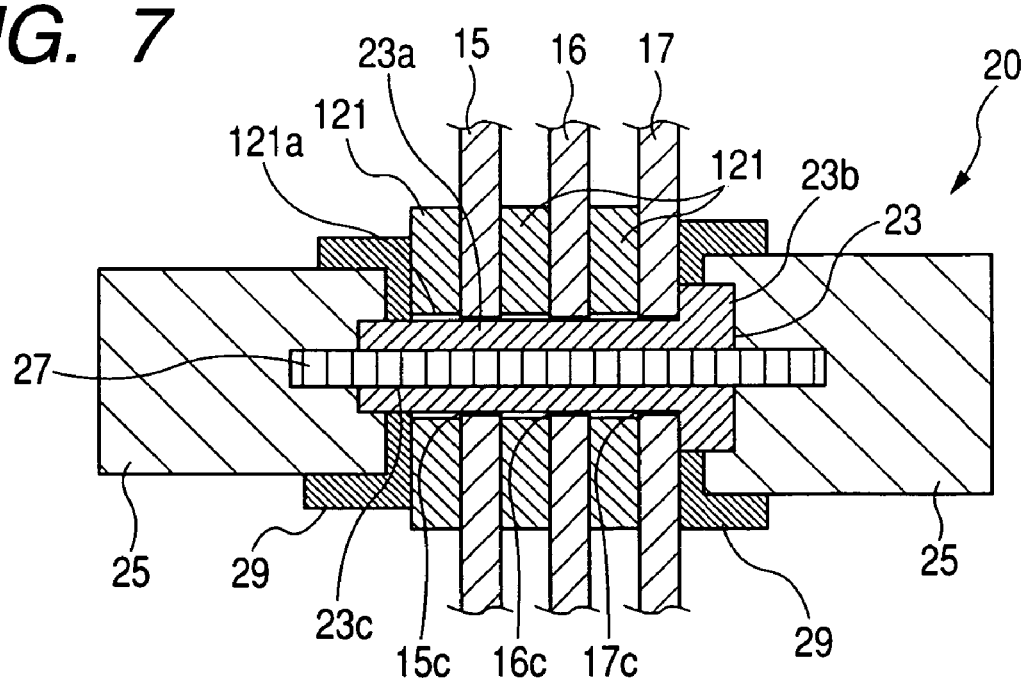
FIG. 7 is a cross sectional view schematically showing the structure of a fixing apparatus in which insulating spacers according to a second embodiment of the present invention are used.

FIG. 7 schematically shows the structure of a fixing apparatus for fixing the first to third grids 15, 16, 17 at predetermined intervals and fixing insulating spacers according to the second embodiment between the grids. The fixing apparatus 120 is composed of insulating spacers 121, an insulating member 23, insulating caps 25, a screw rod 27 and grooved washers 29. The insulating spacer 121 is a disk like member with parallel end faces made of an insulating material such as alumina. The insulating spacer 121 has a through hole 121a with a predetermined diameter that passes through its top and bottom surfaces, formed at its center. The thickness of the disk corresponds to the distance between the grids. The insulating member 23 is a substantially cylindrical member including a shaft portion 23a having an outer diameter that can pass through the through hole 121a of the insulating spacer 121 and an enlarged diameter portion 23b having an enlarged diameter formed at one end thereof. The insulating member 23 has a through bore 23c that passes through it along the axial direction. In this embodiment, an insulating spacer 121 is also provided on the plasma generation chamber side of the grid 15 (namely, on the surface of the grid 15 that is different from its surface facing the grid 16). However, this spacer 121 may be eliminated if downsizing of the fixing apparatus is desired.

On the first to third grids 15, 16 and 17, holes 15c, 16c and 17c having a diameter substantially equal to that of the through hole 121a in the insulating spacer are respectively formed. When the grids are fixed, the grids and the plurality of spacers are alternately arranged, and the insulating member 23 is inserted through the through holes 21a and the holes 15c, 16c and 17c, so that positioning of these parts is achieved. In addition, an insulating spacer 121 is also disposed on the plasma generation chamber side surface of the first grid 15 adjacent to the plasma generation chamber 15. The screw rod 27 is inserted through the through bore 23c of the insulating member 23 in this state, and the insulating caps 25 are secured to both end portions of the screw rod 27 with the grooved washers 29 between. Thus, the grids and the plurality of insulating spacers are held and fixed. In connection with this, although the surface of the insulating caps 25 is exposed to a decompressed space in this embodiment, a metal cap may be additionally set on the surface thereof to protect the insulating caps and other members against adhesion of an electrically conductive film by sputtering to further prevent insulation failure from occurring. By using the above-described fixing apparatus, the insulating members can be sandwiched between the grids. In addition, the intervals of the grids can be varied by changing the thickness of the insulating spacers as needed. In addition, the electric capacitance between the grids can also be adjusted as desired by selecting the material of the insulating spacers 21 from materials with different dielectric constants such as quartz, machinable ceramics, fluorocarbon resins, and polyimide resins in addition to controlling the intervals of the grids.

Figure 8:
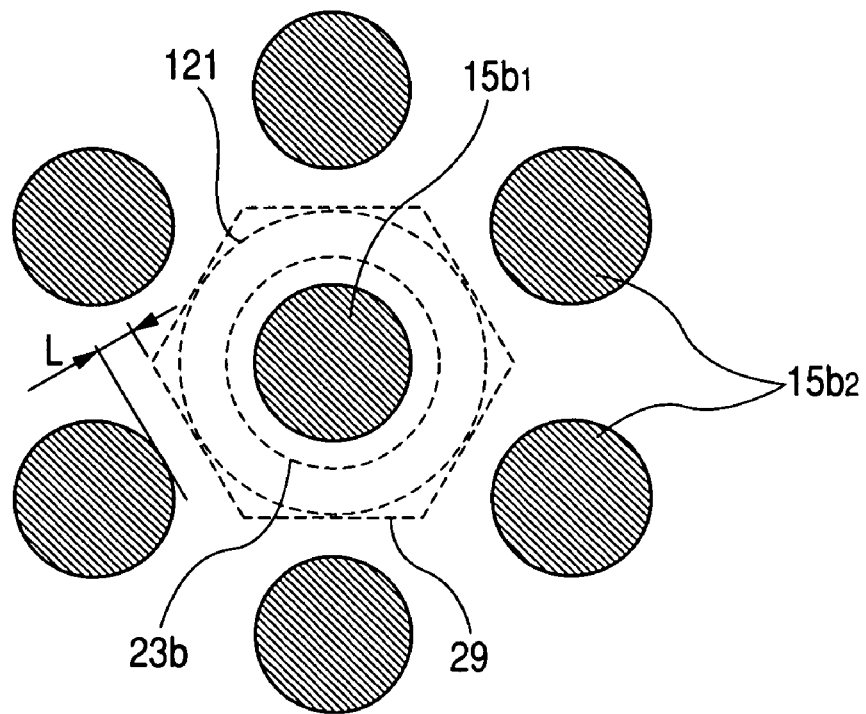
FIG. 8 shows a relationship between the fixing apparatus and small holes of a grid in the state in which the fixing apparatus shown in FIG. 7 is set.

In this embodiment, the predetermined diameter of the through hole passing through the top and bottom surfaces of the insulating spacer disk 121 are designed to be substantially equal to or slightly smaller than the diameter of the small holes of the grid. With this feature, the insulating spacers 121 can be easily fixed by the insulating member 23. The size of the top and bottom surfaces of the disk is larger than the size of the small holes of the grid, and the disk is disposed at a position spaced apart from the edge of the adjacent small holes by a predetermined distance so that it does not give any influence on the ion beam extracted through the adjacent small holes. The grid as seen from the beam extraction direction is shown in FIG. 8. In FIG. 8, the fixing member is attached to the central small hole $15b_1$. The grooved washer 29 and the insulating spacer 121 are disposed in such a way that their edge is spaced apart from the small holes $15b_2$ around by a predetermined distance L. Thus, the fixing apparatus and the insulating spacer can be disposed at any position at which a small hole is formed by means of the fixing apparatus.

The top and bottom surface of the insulating spacer 121 (I.e. the end faces of the disk) are flat surface parallel to each other, and it is possible to keep the distance between the grids always constant by securing the fixing apparatus to the grids with the flat surface being in close contact with each grid. These flat surfaces have a sufficient area as compared to the side surface of the disk, and when a film adhering on the side surface is removed by blast process or other processing, the processing can be applied without causing damages such as deformation of the flat surface. Therefore, even when an operation of removing a adhering film is carried out, the distance between the grids can be kept constant before and after the removal operation.

As described in connection with the first embodiment, a groove portion may be formed on the side surface of the insulating spacer 121 all along its circumference. Adhesion of a film onto the bottom of the groove portion is hard to occur. Accordingly, by employing the above-described structure, the time taken by deterioration of insulation performance of the insulating spacer due to adhering film is prolonged. This leads to the advantageous effect of reduction of the frequency of the adhering film removal operations or reduction of the frequency of replacement of the insulating spacer.

In this embodiment, the description has been directed to a fixing apparatus that is adapted to fix the insulating spacers 121 and the grids 15 to 17 using the insulating member 23, the screw rod 27, the insulating caps 25 and the grooved washers 29. However, the present invention is not limited to this particular embodiment, but the insulating spacers may be fixed using, for example, an insulating member 23 having a screw thread at its ends and nuts or the like made of an insulation material engaging thereto.

Next, an insulating spacer according to the third embodiment of the present invention will be described. The structure of the ion beam apparatus in which the insulating spacer according to this embodiment is used is the same as that described in the second embodiment, and the description thereof will be omitted. In the following description, the portion same as those described in connection with the first embodiment will be referred to with the same reference characters.

Figure 9:
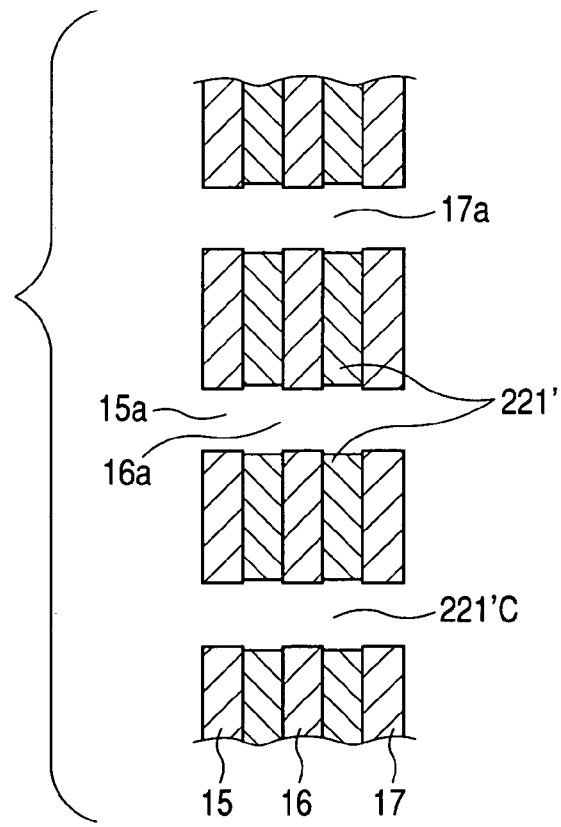
FIG. 9 shows a modification of the first insulating member in a fixing apparatus according to a third embodiment.

Although in the second embodiment, a disk-like first insulating member 121 is used and it is locally sandwiched between grids, this feature is not essential to the present invention. For example, the first insulating member sandwiched between grids may be eliminated, or a first insulating member may be constructed as a plate-like member having small holes 221c' corresponding to plurality of small holes 15b. Furthermore, the first insulating material may be constructed as a substantially disk-like member having a diameter substantially equal to the diameter of the grid and having small holes corresponding to the small holes of the grid. The third embodiment of the present invention has this structure. FIG. 9 is a side view showing the grids and insulating members in the assembled state. With the first insulating member 221' having the illustrated structure, the electric capacitance between the grids can be controlled more precisely. The insulating member 221' constitutes a substantially flat surface made of an insulating material opposed to the plasma. Thus, the plasma is deformed into a flat shape by a sheath formed by the insulating surface. Consequently, it is considered that a plasma in which ions exist substantially uniformly in the area corresponding to the insulating member 221' can be obtained.

Figure 10:
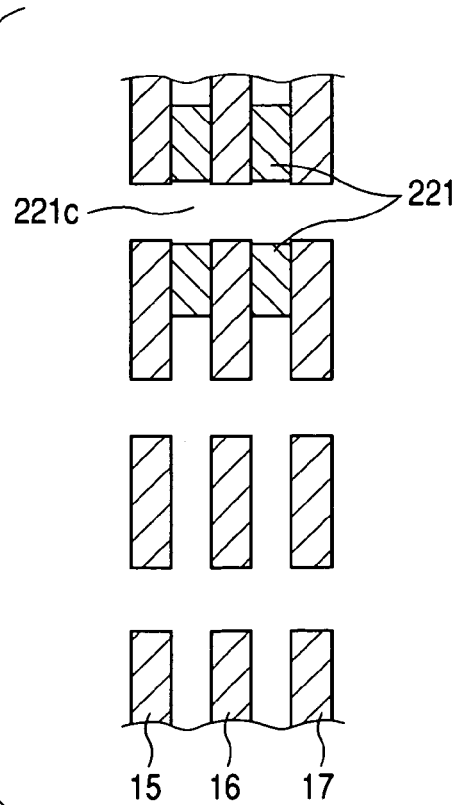
FIG. 10 shows a modification of the first insulating member in the fixing apparatus according to a third embodiment.

Furthermore, as shown in FIG. 10, a first insulating member 221 on which a small hole 221c is formed at its central portion may be disposed separately between adjacent grids and on the surface of the grid that faces the plasma. In this case, the size of the small hole 221c is designed to be substantially equal to the size of the small hole 15c. In addition, in this case, the first insulating member 221 is secured at a predetermined position by, for example, using an adhesive. As per the above, by disposing the first insulating member 221 locally, control of the electric capacitance between the grids and control of the shape of the plasma by forming a certain sheath can be performed over a widened range dependently and more finely.

In this embodiment, a fixing apparatus using a screw rod made of, for example, a stainless steel is used, and the main feature of the present invention resides in the structure for positioning the grids and the first insulating members using the second insulating member and additionally fixing these members to fix the grids and the first insulating members. Therefore, it is preferable that the screw rod etc. be modified for fixing these members. Although the structure of this embodiment includes three grids, the number of the grids used is not limited to this, but the structure may include two or more then three grids.

Next, results of experiments carried out with a milling apparatus using an ion beam irradiation apparatus in which the above-described insulating member, particularly the insulating spacer according to the second embodiment is used, will be described in the following. The milling apparatus basically includes arrangements such as a transfer system for transferring articles to be processed in addition to the above-described structures. However, the additional structures are not directly relevant to the present invention, and the main structure of the apparatus related to the present invention is substantially the same as that described above. Therefore, the description thereof will be omitted. In this example, the article to be processed 13 was an alumina film formed on a silicon wafer having a diameter of 6 inches. Results of milling were obtained by measuring a difference of the alumina film before and after the milling using an optical interference measuring apparatus.

In the milling process, the article to be processed 13 is disposed at an angle of 0° to the ion beam, namely the article to be processed 13 was oriented in such a way that the ion beam is incident on it perpendicularly. The processing pressure upon milling was $1.33^{-2}$ Pa. As a plasma source, argon gas was introduced into the plasma generation chamber at a flow rate of 10 to 20 sccm, and the gas was subjected to discharge by the ICP method. To the grids for acceleration, a voltage of 700V was applied so that an acceleration current of 1100 mA would flow, and to the intermediate grid for deceleration, a voltage of −400V was applied.

In this example, the condition of the alumina after removal by the ion milling was firstly inspected in the state that the fixing apparatus according to the present invention was not used. As a result, we observed a variation of 4.0-6.0% in the milling rate in the processed area of 6 inches. Subsequently, the fixing apparatus (the insulating spacers) was set at a portion on the grids corresponding to the portion in the processed area in which the milling rate is low to correct and stabilize the intervals of the grids.

After that, ion milling was performed again with the apparatus in this state, and the variation in the milling rate was measured. As a result, it was found that the variation in the milling rate had been improved down to 1.0-3.0%. The average of the milling rate was substantially the same before and after setting the fixing apparatus. In the conventional variation reduction method, the milling rate is tuned to the lowest milling rate, and it suffers from a significant decrease in the milling rate. In contrast, it was confirmed that according to the present invention, variations of the milling rate was improved without a decrease in the milling rate, and ions in the plasma were used for milling efficiently.

Figure 11:
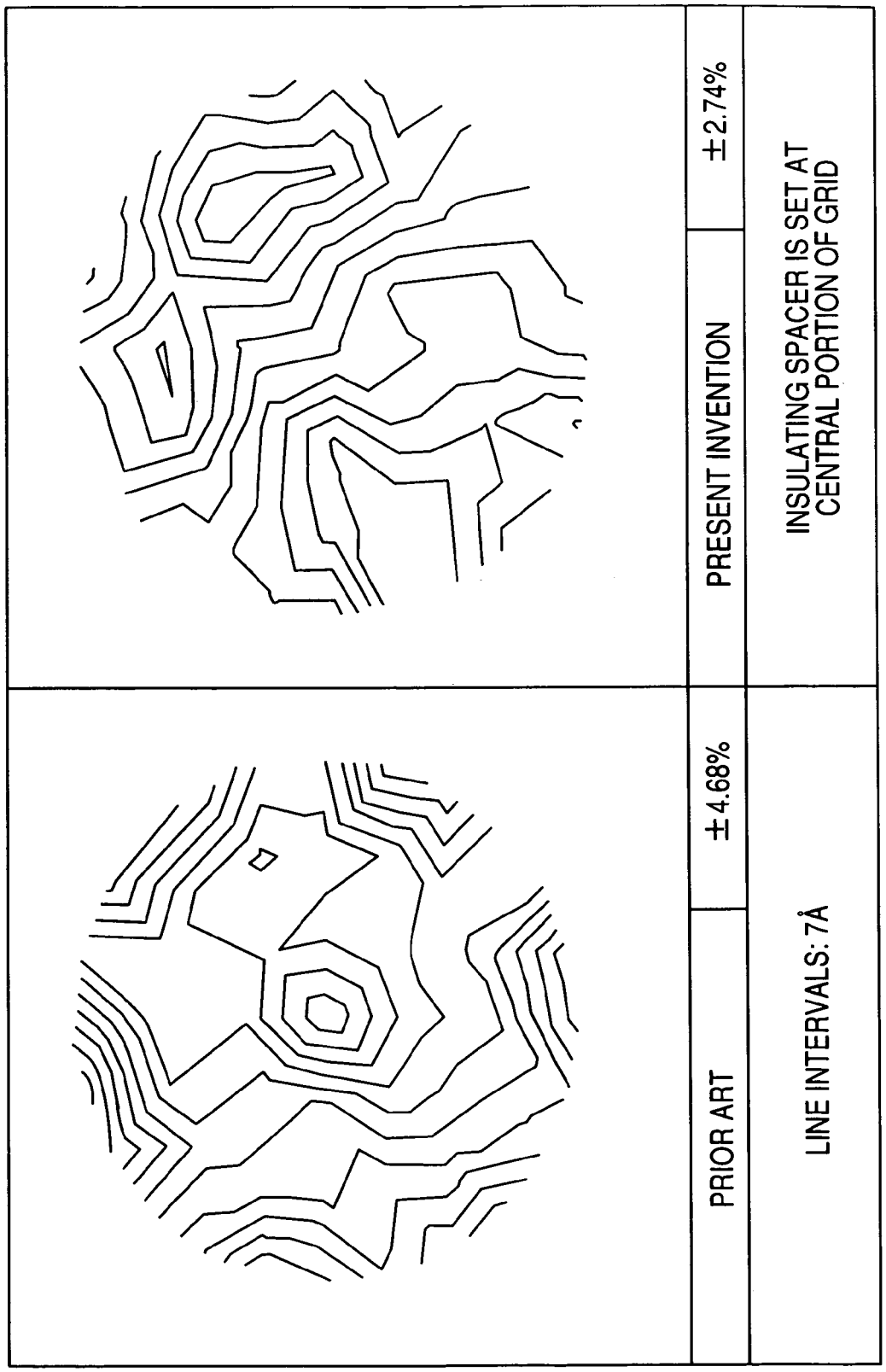
FIG. 11 shows variations in the milling rate in an arrangement in which an embodiment of the present invention is applied and a conventional arrangement in comparison.

Following Table 1 and FIG. 11 show specific results of measurement of the distribution of ion milling rates obtained by using an optical interferometer for milling process applied on a alumina film formed on a silicon wafer of 150 mm in the case of a conventional structure and in the case in which the present invention was applied.

TABLE 1

| | measurement point | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| prior art | 830.9 | 855.2 | 849.2 | 852.4 | 853.1 | 853.0 | 855.1 | 870.3 | 863.9 | 852.0 | 852.3 | 846.7 | 842.5 | 846.8 | 850.1 |
| present invention | 854.0 | 851.4 | 824.3 | 848.8 | 859.5 | 858.9 | 862.2 | 873.5 | 860.6 | 853.3 | 841.7 | 827.0 | 829.3 | 831.1 | 842.0 |

The numerals in Table 1 represent milled amounts in Angstrom unit measured by the optical interferometer after a milling operation of a predetermined time for arbitrary fifteen measurement points. In FIG. 11, the measurement points were increased and differences in the milled amounts are represented as contour lines. It will be understood from FIG. 11 that a singular point in the central portion of the wafer disappeared by the application of the present invention. It will also be seen that variations of the milled amounts had been reduced.

Following Table 2 shows milling rates and degrees of their variations in relation to the support angle of the holder relative to the ion beam irradiation direction for the case of a prior art arrangement and the case in which the present invention was applied.

TABLE 2

| | prior art | | present invention | |
|---|---|---|---|---|
| support angle | milling rate | uniformity | milling rate | uniformity |
| 0° | 321.6 A/min | 4.68% | 318.2 A/min | 2.74% |
| −30° | 516.8 A/min | 6.06% | 501.5 A/min | 3.95% |
| −45° | 679.9 A/min | 4.16% | 668.9 A/min | 3.35% |
| −70° | 483.4 A/min | 9.54% | 484.0 A/min | 4.69% |

It will be understood from Table 2 that, with application of the present invention, the milled amount was made more uniform irrespective of the changes in the support angle. In addition, it was confirmed that when the present invention was applied, the milling rate was substantially equal to that in the prior art.

In the above-described embodiments, the present invention is applied to an ion milling apparatus. However, application of the present invention is not limited to this type of apparatus. The present invention can also be applied to various apparatuses using vacuum such as an ion implanting apparatus, an ion beam deposition apparatus, an ion beam sputtering apparatus, or a CVD apparatus. In addition, although in the above-describe embodiments the article to be processed is an alumina film, various films such as a ceramic film, a metal film or an organic film can also be processed.

This application claims priority from Japanese Patent Applications No. 2004-051462 filed Feb. 26, 2004, No. 2004-051457 filed on Feb. 26, 2004, No. 2004-051459 filed on Feb. 26, 2004, and No. 2004-094332 filed on Mar. 29, 2004 which are hereby incorporated by reference herein.

What is claimed is:

1. An ion beam irradiation apparatus comprising:
   a plasma generation chamber in an interior of which a plasma is generated;
   a process chamber connected with said plasma generation chamber;
   a plurality of grids disposed between said plasma generation chamber and said process chamber to extract ions in said plasma from said plasma generation chamber to said process chamber, each of said grids having a plurality of holes; and
   an insulating spacer disposed between said grids for preventing said grids from being in electrical contact with each other,
   wherein a groove portion is formed along a circumference, which is different from surfaces abutting said grid, of said insulating spacer, said groove portion is recessed from said circumference of said insulating spacer in a direction different from a direction in which said ion beam is extracted, and a ratio of an opening of said groove portion to a depth of said groove portion is equal to or larger than 1,
   said groove portion is recessed from said circumference of said insulating spacer in a direction perpendicular to the direction in which said ion beam is extracted, and
   an edge portion of said groove portion that defines said opening of said groove portion is chamfered.

2. An ion beam irradiation apparatus according to claim 1, wherein said insulating spacer has a cylindrical shape, and said groove portion is formed on a side surface of said cylindrical shape.

3. An ion milling apparatus comprising:
   an ion beam irradiation apparatus according to claim 1; and
   a holder disposed in said process chamber, for holding an article to be processed at a position at which it is irradiated with said extracted ions.

4. An insulating spacer to be used in an ion beam irradiation apparatus comprising:
   a plasma generation chamber in an interior of which a plasma is generated;
   a process chamber connected with said plasma generation chamber; and
   a plurality of grids disposed between said plasma generation chamber and said process chamber for extracting ions in said plasma, each of said grids having a plurality of holes, and said insulating spacer being disposed between said plurality of grids to prevent said grids from being in electrical contact with each other,
   wherein a groove portion is formed along a circumference, which is different from surfaces abutting said grid, of said insulating spacer, said groove portion is recessed from said circumference of said insulating spacer in a direction different from a direction in which said ion beam is extracted, and a ratio of an opening of said groove portion to a depth of said groove portion is equal to or larger than 1, said groove portion is recessed from said circumference of said insulating spacer in a direction perpendicular to the direction in which said ion beam is extracted, and an edge portion of said groove portion that defines said opening of said groove portion is chamfered.

5. An insulating spacer according to claim 4, wherein said insulating spacer has a cylindrical shape, and said groove portion is formed on a side surface of said cylindrical shape.

6. An ion beam irradiation apparatus adapted to extract ions contained in a plasma generated in a plasma generation chamber through holes formed on a plurality of grids to generate an ion beam, comprising:

an insulating member disposed between said plurality of grids or on a plasma generation chamber side surface of the grid that is adjacent to the plasma generation chamber, and on a portion of the grids that corresponds to an area over which the ion beam is extracted, wherein said holes are arranged on said plurality of grids in such a way as to be aligned in a predetermined direction, and said insulating member has a shape that does not interfere with the alignment of said holes when the insulating member is set, and said insulating member disposed on said plasma generation chamber side surface of said grid adjacent to said plasma generation chamber is disposed at a position corresponding to an area in which the quantity of ions in the extracted ion beam in a state in which said insulating member is not set is small, and the insulating member is configured to be disposed at any position at which one of said holes is formed.

7. An ion beam irradiation apparatus according to claim 6, wherein the insulating member disposed between said grids comprises a sheet-like member having holes aligned with the holes of said grids, said insulating member adjusting an electric capacitance between the plurality of grids to a predetermined value.

8. An ion beam irradiation apparatus according to claim 7, wherein said insulating member has a substantially disk-like shape corresponding to said grids.

9. An ion beam irradiation apparatus according to claim 6, wherein the insulating member disposed on said plasma generation chamber side surface of said grid adjacent to said plasma generation chamber comprises a sheet-like member having holes aligned with the holes on said grid, and a flat ion sheath is formed on a surface of said insulating member.

10. An ion beam irradiation apparatus according to claim 9 wherein said insulating member has a substantially disk-like shape corresponding to said grid.

11. An ion milling apparatus comprising:

an ion beam irradiation apparatus according to claim 6;

a process chamber into which ions extracted from said ion beam irradiation apparatus is to be introduced; and a holder disposed in said process chamber, for holding an article to be processed at a position at which it is irradiated with said extracted ions.

* * * * *